April 28, 1959 V. J. CORTESE 2,884,526
OSCILLATOR OUTPUT CIRCUIT
Filed Dec. 2, 1957
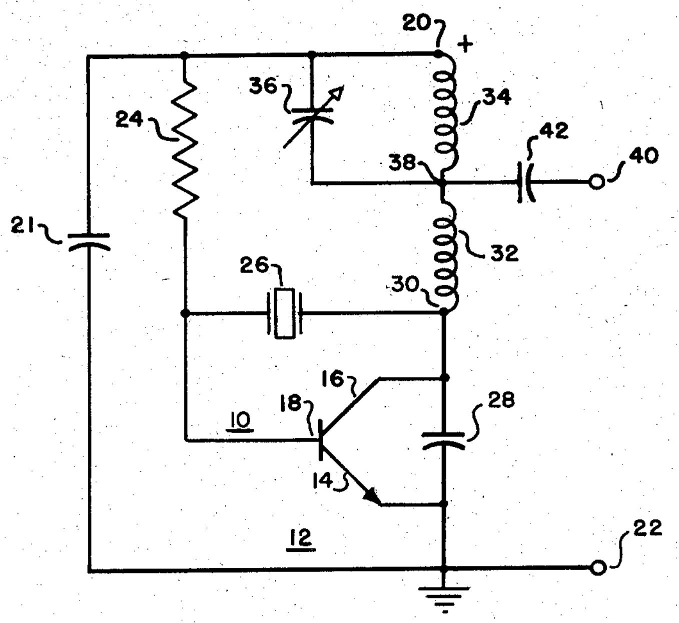
INVENTOR,
VINCENT J. CORTESE.
BY Harry M. Saragovitz
ATTORNEY.

United States Patent Office 2,884,526

Patented Apr. 28, 1959

2,884,526

OSCILLATOR OUTPUT CIRCUIT

Vincent J. Cortese, Neptune Township, N.J., assignor to the United States of America as represented by the Secretary of the Army Application December 2, 1957, Serial No. 700,238

1 Claim. (Cl. 250—36)

(Granted under Title 35, U.S. Code (1952), sec. 266)

The invention described herein may be manufactured and used by or for the Government for governmental purposes, without the payment of any royalty thereon.

This invention relates to oscillators and particularly to crystal controlled transistor oscillators. More particularly, this invention relates to a means for improving the waveform and the efficiency of an oscillator output.

Oscillators are basic and need no detailed discussion here. With the advent of transistors, almost all forms of oscillators were revised to combine the various forms of positive feedback with the distinctive impedances and other characteristics of the transistor amplifiers. A discussion of transistor oscillators may be seen, for example, in "Transistors Handbook," pages 232 to 267, of William Dealtry Bevitt, published by Prentice-Hall, Inc., 1956.

Frequency stabilizing devices, such as crystals, are needed in transistor oscillators as in any other type of oscillators to improve the frequency characteristics. However, the addition of a crystal to some transistor oscillators appears to cause a poor waveform of oscillation with high harmonic content, relatively low output, and comparatively low efficiency.

It is therefore an object of this invention to provide an improved crystal controlled transistor oscillator having a relatively high output voltage.

It is a further object of this invention to provide an improved output circuit for a transistor oscillator to reduce the harmonic content of the oscillations.

It is a further object of this invention to provide a crystal controlled transistor oscillator having a good waveform and a relatively high output voltage.

These and other objects are accomplished by connecting an inductive voltage divider across the output terminals of a crystal controlled transistor oscillator; one of the arms of the voltage divider being connected in parallel with a capacitive element to form a resonant circuit tuned to the frequency of the oscillator and providing a source of output signals.

The single figure illustrates a preferred embodiment of the invention.

This circuit will be more particularly described in the following specification and in the drawing.

Referring more particularly to the drawing, an oscillator 10 comprises a transistor 12 having emitter, collector, and base electrodes 14, 16, and 18, respectively; a crystal 26 connected across the collector and base electrodes of the transistor to stabilize the frequency of oscillation to that of the crystal or to one of its harmonics; and a feedback condenser 28. The power is supplied to the transistor oscillator from the source of voltage 20 through resistor 24 to the base electrode of the transistor. The emitter electrode of the transistor is grounded and the collector electrode is connected through a load impedance network to the source of potential 20. The condenser 28 is connected across the collector and emitter electrodes of the transistor to provide the necessary positive feedback to establish the condition necessary for oscillation.

This basic oscillator configuration is essentially a transistorized analogy of the "Pierce" oscillator seen, for example, in Page 63, Fig. 406 of the Radio Amateurs Handbook of 1942, published by the American Radio Relay League. The frequency of oscillation is established by the crystal 26.

The output of this transistor oscillator would normally be taken between point 30 and a grounded connection such as ground terminal 22 or the voltage supply terminal 20, which is also at ground potential for alternating currents through the action of the filter condenser 21. However, in this invention, the inductances 32 and 34 are connected in series and a condenser 36 is connected in parallel with the "grounded" inductance 34 to provide a resonant circuit which is tuned to the resonant frequency of the transistor oscillator; and the output of the oscillator is taken from between point 38 and ground.

The one output terminal 40 is connected to 38 through an isolating condenser 42. The other output terminal may be the one alternating current grounded terminal 20 or, as shown here, the other grounded terminal 22.

In operation the inductive network of this invention applied across the output of the transistor oscillator acts as a filter to reduce the harmonic and other forms of distortion that are prevalent in transistor oscillators and that are accentuated by the use of the crystal. This network provides a very much improved waveform across the new output terminals 40 and 22. However, even though the inductances 32 and 34 are connected in the form of a voltage divider, the actual output voltage is substantially greater than would be expected from the application of the voltage divider to a circuit. The alternating current voltage output taken across coil 34 in this invention may approach or even exceed the voltage that is applied across the voltage divider coils 32 and 34 at the conventional output point 30 of the transistor oscillator.

The condenser 36 which is used to provide a resonant circuit in combination with inductance 34 may be variable for precise tuning and to cover the range of frequencies to be expected from the oscillator 10.

In a typical circuit constructed according to this invention, a 2N27 NPN transistor is used with a 100 kc. crystal, the condenser 21 is .01 microfarads, condenser 28 is 330 micro-microfarads, and the condenser 36 is 525 micro-microfarads and is variable. The inductances 32 and 34 are 10 millihenries with a Q between 60 and 70 at about 270 kilocycles. The resistor 24 is 47,000 ohms and the voltage between 20 and 22 is one and one-half volts.

Although the oscillator 10 has been chosen for use here, this invention is not limited to this particular form of oscillator since the same improvement in output voltage and waveform may be obtained by using this inductive output network in combination with other well known oscillator circuits.

Having thus described my invention, what is claimed is:

In a circuit for producing electrical oscillation at a given frequency, a transistor having emitter, base, and collector electrodes; a first condenser connected across said emitter and collector electrodes, a crystal resonant at said given frequency connected between said base and collector electrodes, said emitter electrode being at ground potential, a source of positive potential with respect to said ground potential, a first resistor connected between said source of potential and said base electrode, a first and second inductances connected in series between said collector electrode and said source of potential, a second condenser connected between the junction of said first and second inductors and said source of potential to form a parallel circuit resonant at said given frequency, a third condenser and an output load connected between said junction of said first and second inductors and said ground potential.

References Cited in the file of this patent

UNITED STATES PATENTS

| | | |
|---|---|---|
| 2,755,384 | Pierson et al. | July 17, 1956 |
| 2,808,513 | Maynard et al. | Oct. 1, 1957 |